US010674625B1

(12) United States Patent
Leung et al.

(10) Patent No.: US 10,674,625 B1
(45) Date of Patent: Jun. 2, 2020

(54) RACK SIDEPLANE FOR INTERCONNECTING DEVICES

(71) Applicant: Facebook, Inc., Menlo Park, CA (US)

(72) Inventors: Che Kin Leung, Fremont, CA (US); Zhiping Yao, Dublin, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/057,431

(22) Filed: Aug. 7, 2018

(51) Int. Cl.
*H05K 7/14* (2006.01)
*H05K 5/02* (2006.01)

(52) U.S. Cl.
CPC .......... *H05K 7/1452* (2013.01); *H05K 5/023* (2013.01); *H05K 7/1401* (2013.01); *H05K 7/1487* (2013.01); *H05K 7/1489* (2013.01)

(58) Field of Classification Search
None
See application file for complete search history.

(56) References Cited

U.S. PATENT DOCUMENTS

| 7,239,528 B1* | 7/2007 | McLeod | H05K 7/1445 211/41.17 |
| 2004/0252467 A1* | 12/2004 | Dobbs | G06F 1/16 361/752 |
| 2005/0032398 A1* | 2/2005 | Perret | H05K 1/147 439/67 |
| 2008/0112133 A1* | 5/2008 | Torudbakken | H04Q 1/04 361/694 |
| 2013/0208420 A1* | 8/2013 | Franklin | H05K 7/1488 361/695 |
| 2016/0262282 A1* | 9/2016 | Li | H01R 43/205 |

* cited by examiner

*Primary Examiner* — Xanthia C Cunningham
(74) *Attorney, Agent, or Firm* — Van Pelt, Yi & James LLP

(57) ABSTRACT

A rack sideplane for interconnecting devices is disclosed. In an embodiment, the system includes a vertical connection interface sideplane and a mounting adapter. The sideplane is configured to be removably attached to the mounting adapter. The sideplane is configured to route one or more connections between devices mounted on a network rack via a protected channel in between the vertical connection interface sideplane and the mounting adapter.

20 Claims, 21 Drawing Sheets

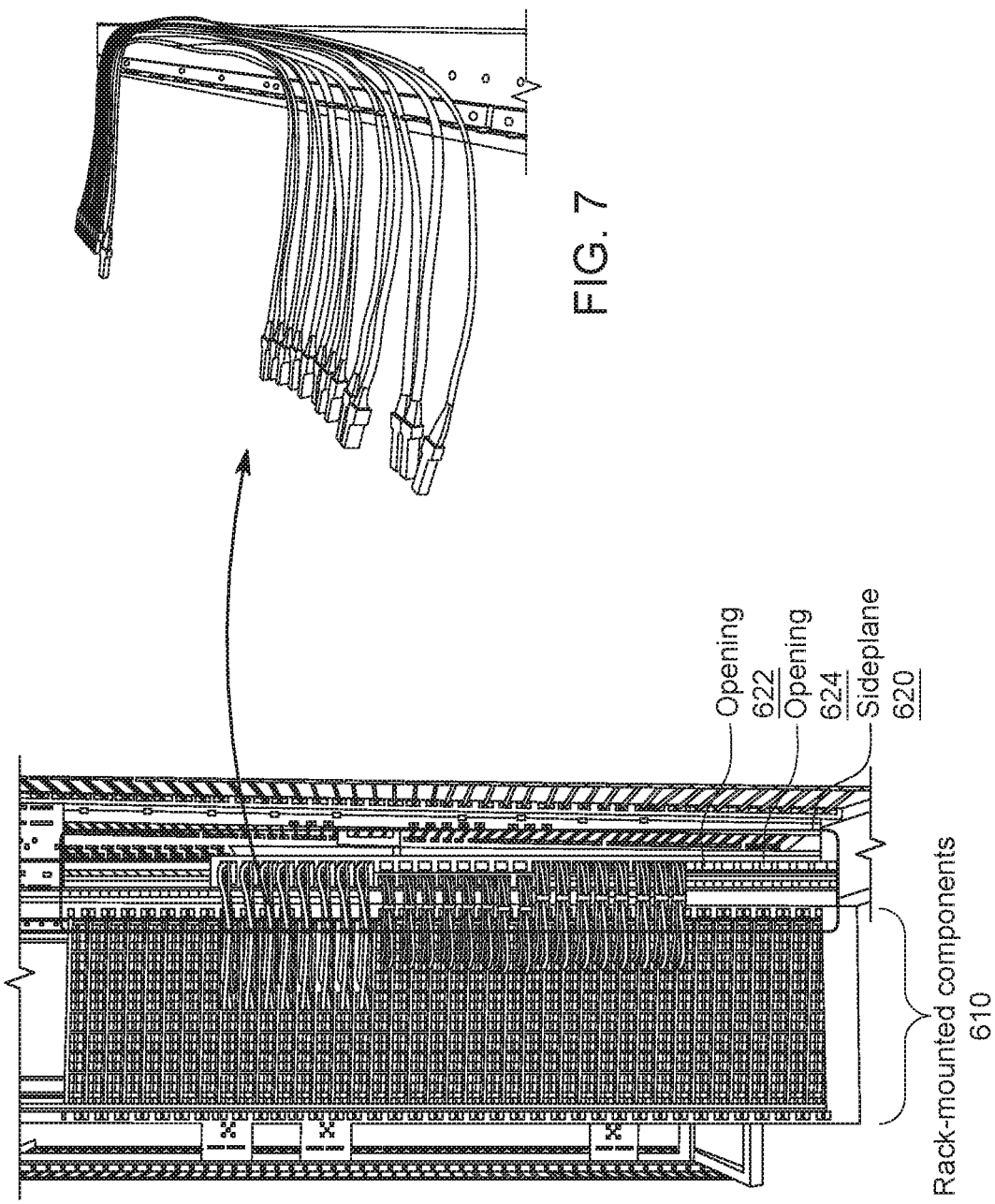

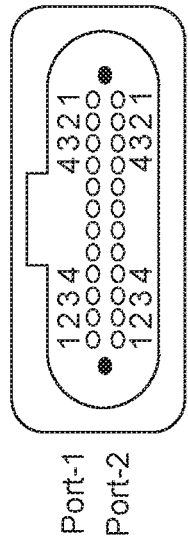
FIG. 13
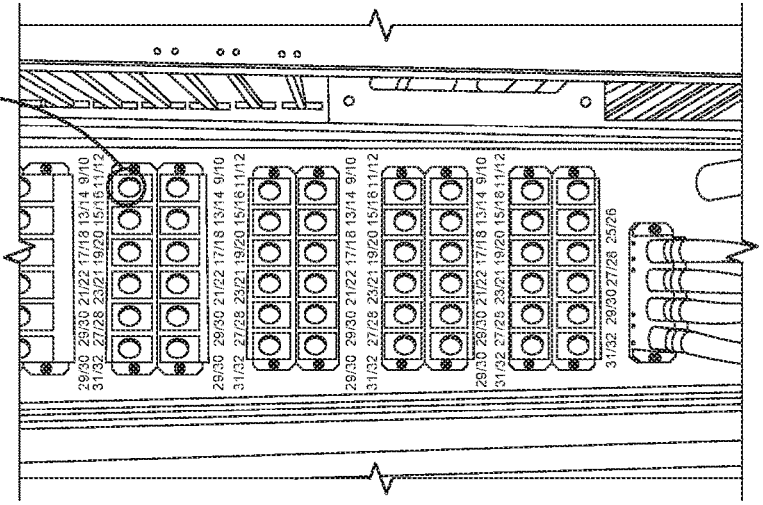
FIG. 14
FIG. 16
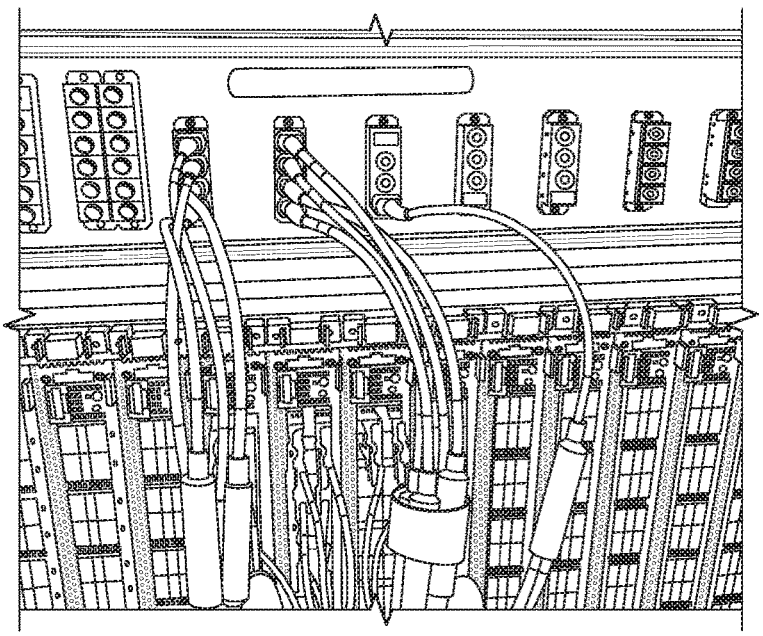
FIG. 15

US 10,674,625 B1

RACK SIDEPLANE FOR INTERCONNECTING DEVICES

BACKGROUND OF THE INVENTION

Data centers house network infrastructure devices such as servers. A server is typically made up of a stack of network racks. When a user visits a Web page, uses an application, or otherwise interacts with an Internet-based service, the user's requests are handled by data centers. Network infrastructure scales and evolves to adapt to application needs. As online streaming, virtual reality, and other data-heavy applications become more popular, datacenters are evolving to meet the pace of the demand for a faster and more seamless user experience. The connections between network racks are typically physical cables. One challenge for data centers is managing cabling complexity.

BRIEF DESCRIPTION OF THE DRAWINGS

Various embodiments of the invention are disclosed in the following detailed description and the accompanying drawings.

FIG. 6 illustrates an embodiment of a vertical connection interface sideplane with direct attached cable (DAC) connections.

FIG. 7 shows an example of direct attached cable (DAC) cables routed through a cross section of a sideplane channel.

FIG. 13 shows an example of a dual pigtail active optical cable (AOC) cable.

FIG. 14 shows an example of a pigtail active optical cable (AOC) pinout of a connector.

FIG. 15 illustrates an embodiment of a panel of a vertical connection interface sideplane with a pigtail active optical cable (AOC).

FIG. 16 illustrates an embodiment of a front panel of a vertical connection interface sideplane for a pigtail active optical cable (AOC).

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A rack sideplane for interconnecting devices is disclosed. Embodiments of the rack sideplane (sometimes called "vertical connection interface sideplane" or simply "sideplane") find application in server assemblies and data centers. The rack sideplane optimizes intra-rack connections among component network switches for better cable management, easy operation, and lower power and cost. A protected channel for cable management is mounted to the side of a server rack. This rack sideplane routes direct copper attachment cables in a first use case and optical cables (with pigtail interfaces) in a second use case.

Figure 1:
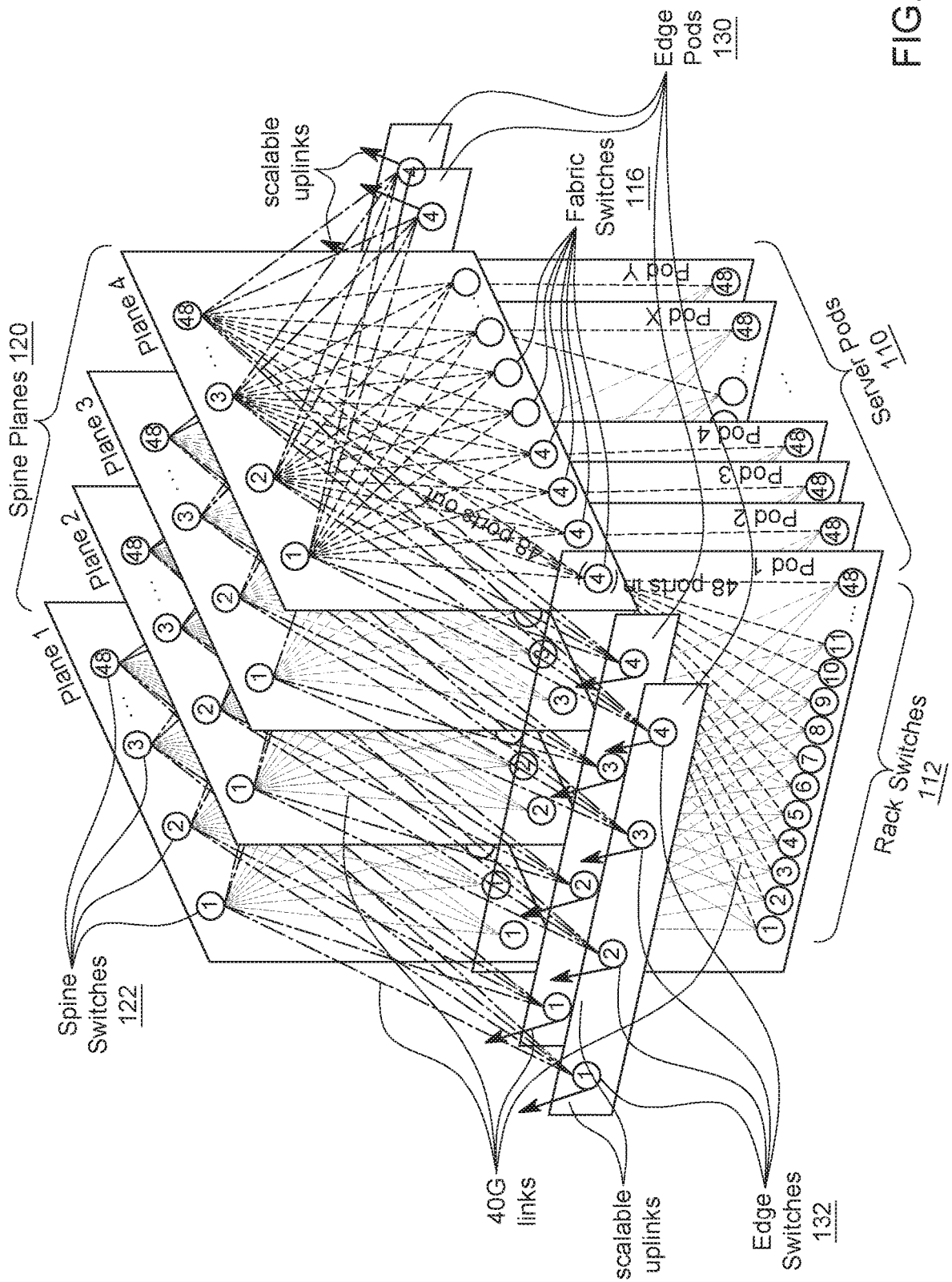
FIG. 1 shows an example of a data center network topology in which a vertical connection interface sideplane can be utilized.

FIG. 1 shows an example of a data center network topology in which a vertical connection interface sideplane can be utilized. Unlike conventional data centers that use large devices and clusters connected together in a large mesh, the network here is disaggregated in the sense that smaller identical network units (e.g., server pods 110) are used and interconnected using various different network planes. The server pods are communicatively coupled to each other, e.g., by high-performance links.

In various embodiments, a server pod is a standard "unit of network," and functions as a logical switch. Each server pod includes fabric switches 116 and rack switches 112 (sometimes called top of rack or TOR switches). In this example, each pod is served by a set of four fabric switches for a 3+1 four-post architecture for server rack TOR uplinks, where each TOR has 4×40G uplinks, providing a total of 160G bandwidth capacity for a rack of 10G-connected servers. A server pod may be much smaller than a unit of network in a conventional data center, e.g., the server pod here has 24 server racks. This size may be advantageous because most basic mid-size switches can service the pods. A relatively smaller port density of fabric switches makes the internal architecture simple, modular, and robust. In some embodiments, for each downlink port to a TOR, an approximately equal amount of uplink capacity is reserved, allowing network performance to be scaled up to statistically non-blocking.

In FIG. 1, there are four spine planes 120, which are independent planes of spine switches 122. In this example, each spine plane is scalable up to 48 independent devices within the plane. Each fabric switch of each pod connects to each spine switch within its local plane. Together, the pods and planes form a modular network topology capable of accommodating hundreds of thousands of 10G-connected servers.

External connectivity (e.g., to external network) is provided by edge pods 130, which has edge switches 132 to which deliver data to the backbone and to back-end internal fabrics. For example, the edge pods can provide around 7.68 Tbps to the backbone and is callable to 100G and higher port speeds within the same device form factors. The network topology is scalable. In this regard, the number of fabric switches and rack switches can be increased or decreased to meet performance goals. Server pods can be added to provide more compute capacity, spine switches can be added for more intra-fabric network capacity, and edge pods or scale uplinks can be added for more extra-fabric connectivity. Therefore, compared with conventional data center networks, processing is improved and client requests are serviced in a more efficient manner.

The number, placement, and capacity of planes, switches, and links shown here are merely exemplary and not intended to be limiting. The disaggregated architecture and the implementation of the switches shown in FIG. 1 typically involves additional cabling overhead between downstream and upstream layers. The techniques described here reduce cabling complexity to improve the effectiveness of the disaggregated network topology. Any of the switches shown in FIG. 1 (e.g., spine switches, fabric switches, rack switches, and edge switches) can be implemented using a plurality of physical component switches that together form a single logical switch. For example, the component switches of the logical switch shown in FIG. 2 may represent a single switch in the example of FIG. 1. Using component network switches to build a single logical network switch adds further complexity in wiring required to connect the component network switches together. As described herein, use of a sideplane to manage wiring between components on a network rack simplifies the management, implementation, and troubleshooting of the connection wiring.

Figure 2:
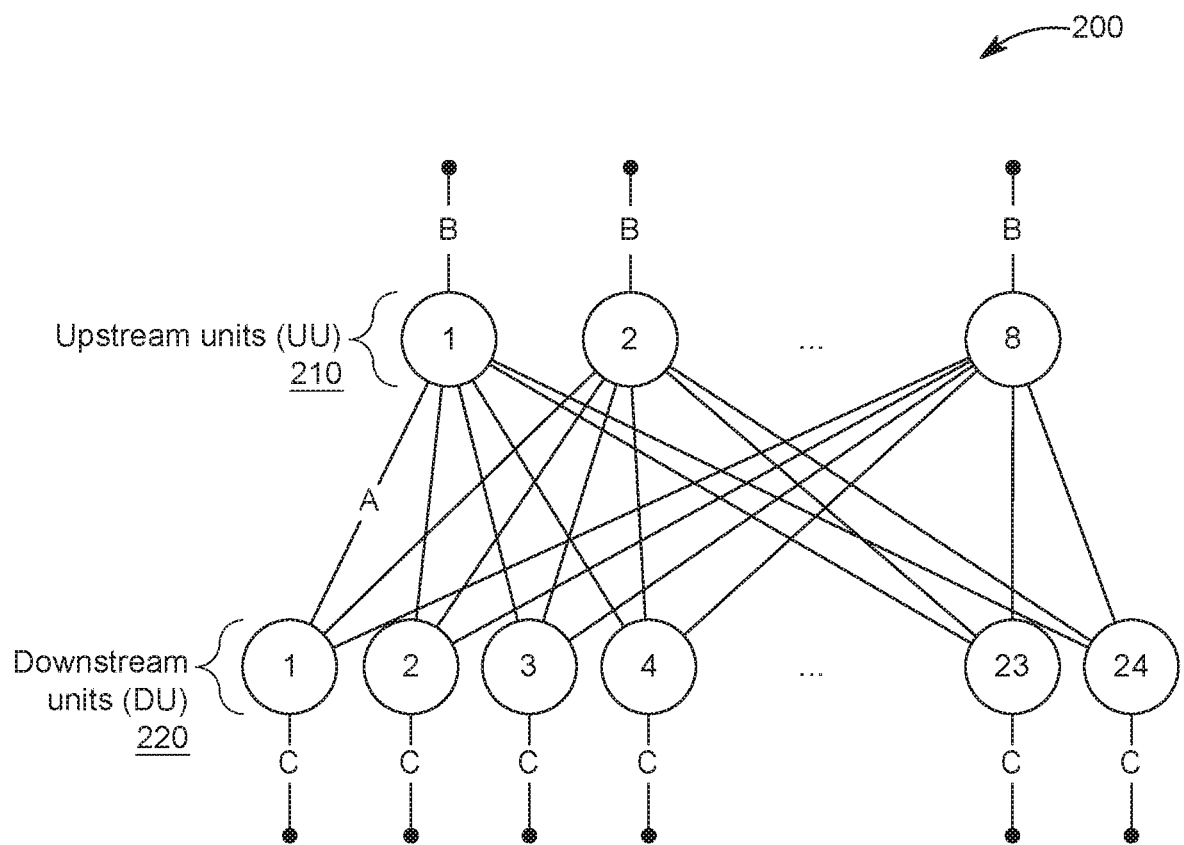
FIG. 2 is a block diagram illustrating an embodiment of a logical switch for which a vertical connection interface sideplane can be provided.

FIG. 2 is a block diagram illustrating an embodiment of a logical switch for which a vertical connection interface sideplane can be provided. The components shown in FIG. 2 comprise a logical switch 200, and is an example of an implementation of a logical switch (or a portion of a logical switch) in FIG. 1 using a plurality of physical component switches. By combining together component switches of lower capacity (and associated lower cost), a single logical switch of higher capability/capacity can be built. Logical switch 200 can be a Layer 3 micro-cluster that is not necessarily defined by physical properties.

Logical switch 200 includes upstream units 210 (UU) and downstream units 220 (DU). The UUs connect to upstream components and the DUs connect to downstream components. Suppose logical switch 200 is used to implement a fabric switch 226 of FIG. 1. Then, UUs connect to upstream components such as spine switches, and DUs connect to downstream components such as rack switches.

Here, the eight UUs are connected to 24 DUs by the connections shown. The capacity of the link between a UU and a DU can be 100G (represented by "A" in the figure). There are typically a large number of such ("A") links in a server pod, and the techniques disclosed here reduce complexity, power consumption, and the cost of implementing these links. In addition, if a link or a switch connected to a link fails, it is difficult in conventional systems to identify the location of the failure. The sideplane described here facilitates troubleshooting because an exact location of a failure can be quickly detected because of the organized port numbering and cable routing. For clarity, only one of the links is labeled "A," but each of them may have 100G capacity. The capacity of the link of a UU can be 8×100G (represented by "B" in the figure). The capacity of the link of a DU can be 24×100G (represented by "C" in the figure). The number and placement of switches and links shown here is merely exemplary and not intended to be limiting.

In various embodiments, each UU is a physical switch and each DU is a physical switch. Thus, cabling between the physical switches can become complex. Using the example shown of 8 UUs×24 DUs, there are 192 UU-DU links. Cable complexity can be managed using a sideplane as shown in the following figure.

Figure 3:
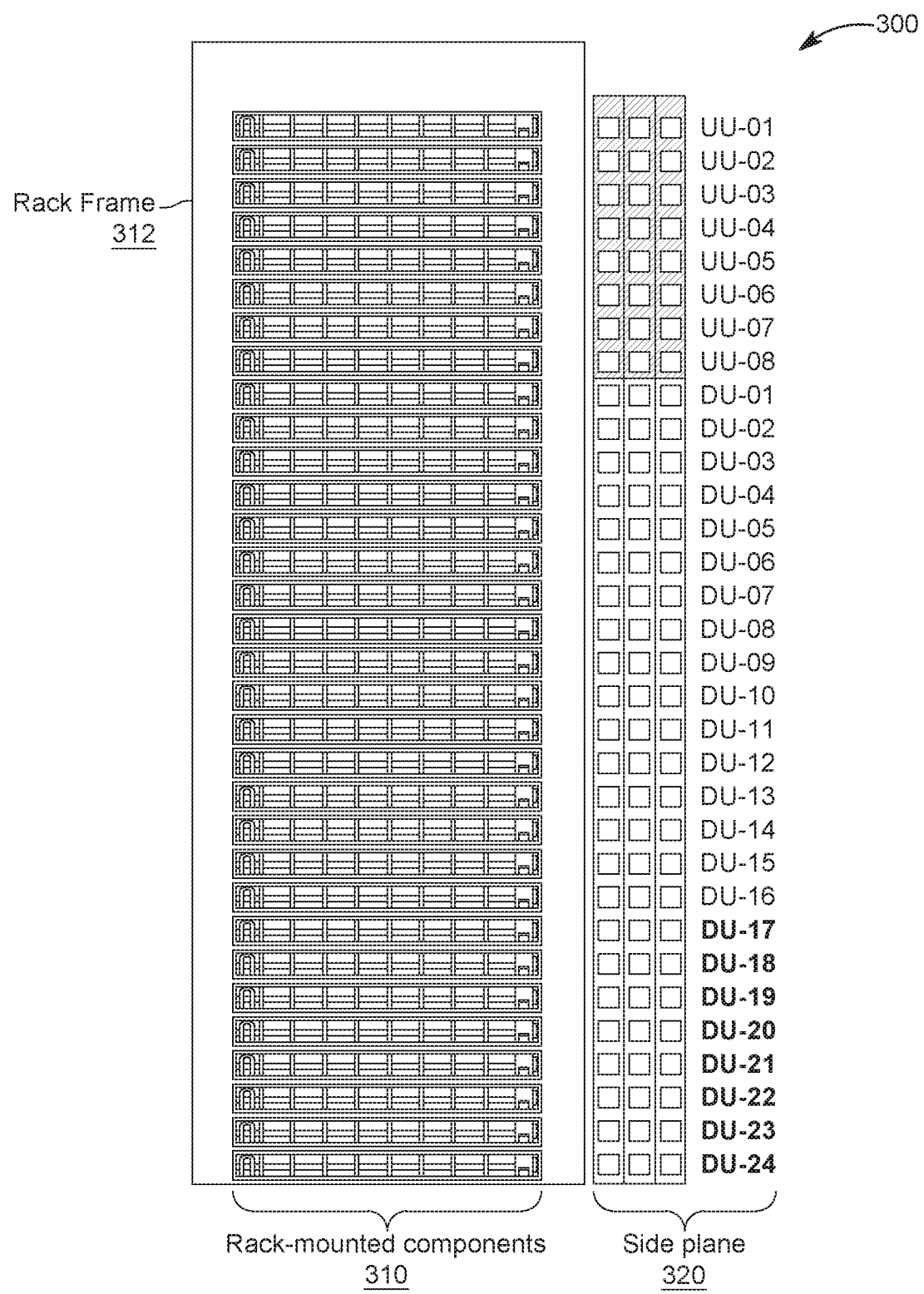
FIG. 3 shows an example of a rack system with a vertical connection interface sideplane according to an embodiment of the present disclosure.

FIG. 3 shows an example of a rack system with a vertical connection interface sideplane according to an embodiment of the present disclosure. This figure illustrates the physical components of a logical switch built using rack mounted component switches, corresponding to logical switch 200 of FIG. 2.

The example switch assembly 300 includes rack-mounted components mounted inside a frame of the network rack (rack frame 312). The rack-mounted components are sometimes called devices mounted on the network rack. The example switch assembly also includes vertical connection interface sideplane 320. The sideplane is disposed alongside the rack frame to facilitate cable management. In some embodiments, the sideplane is removably attached to a mounting adapter (not shown), and the mounting adapter is coupled to the rack frame directly. In some embodiments, the mounting adapter is coupled to a vertical cable management unit (not shown here, further described with respect to FIG. 5A), and the vertical cable management unit is attached to the rack frame.

Figure 10:
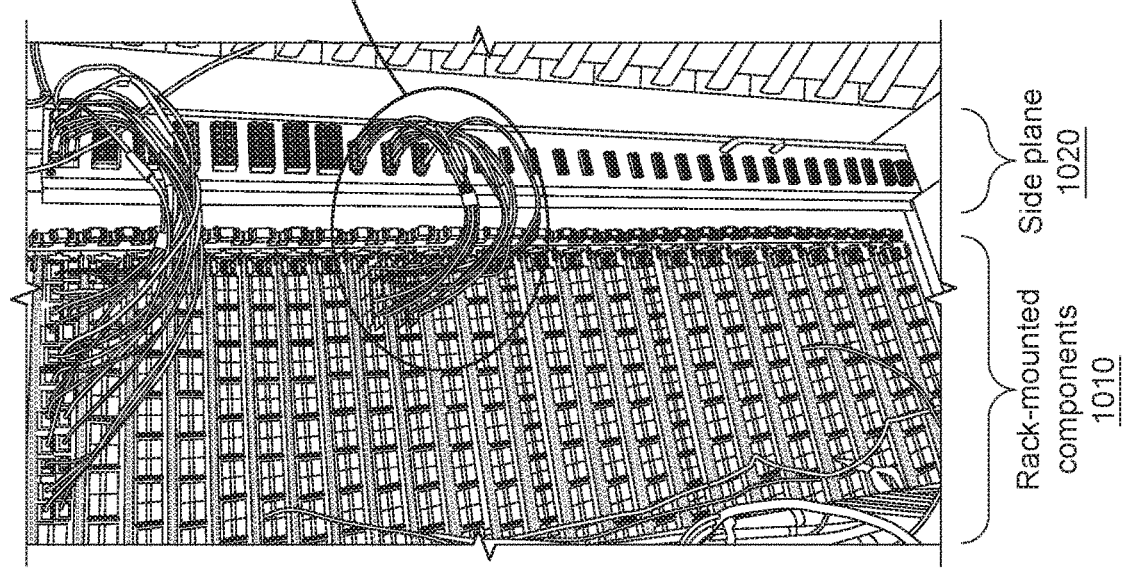
FIG. 10 illustrates an embodiment of a vertical connection interface sideplane with pigtail active optical cable (AOC) connections.

Server assembly 300 includes 32 rack-mounted components, of which 8 are UUs and 24 are DUs. This example corresponds to the one shown in FIG. 2. The UUs are labeled "UU-01" to "UU-08", and the DUs are labeled "DU-01" to "DU-24". The upstream and downstream units can be interconnected using sideplane 320. The sideplane may increase operational ease for example by simplifying cabling, making it easier to identify an exact location where an error occurred, decrease weight, decrease power consumption, and decrease cost. Network cables interconnecting rack-mounted components 310 and routed via sideplane 320 have not been shown in FIG. 3. The UUs and DUs may be interconnected as further described below. For example, they may be connected via directed attachment cables (FIG. 6) or active optical cables (FIG. 10). A sideplane like the one shown here and in the figures below can be produced automatically (e.g., by a robotic arm) or manually by providing and connecting the components.

The number and placement of rack-mounted components is exemplary and not intended to be limiting. Here, the rack-mounted components are UUs and DUs. In other embodiments, they may be other types of components. The interconnections between UUs and DUs can be complex and expensive to implement. The sideplane described here support a variety of connection schemes. Some example connection schemes are shown in FIGS. 4A-4C.

Figure 4A:
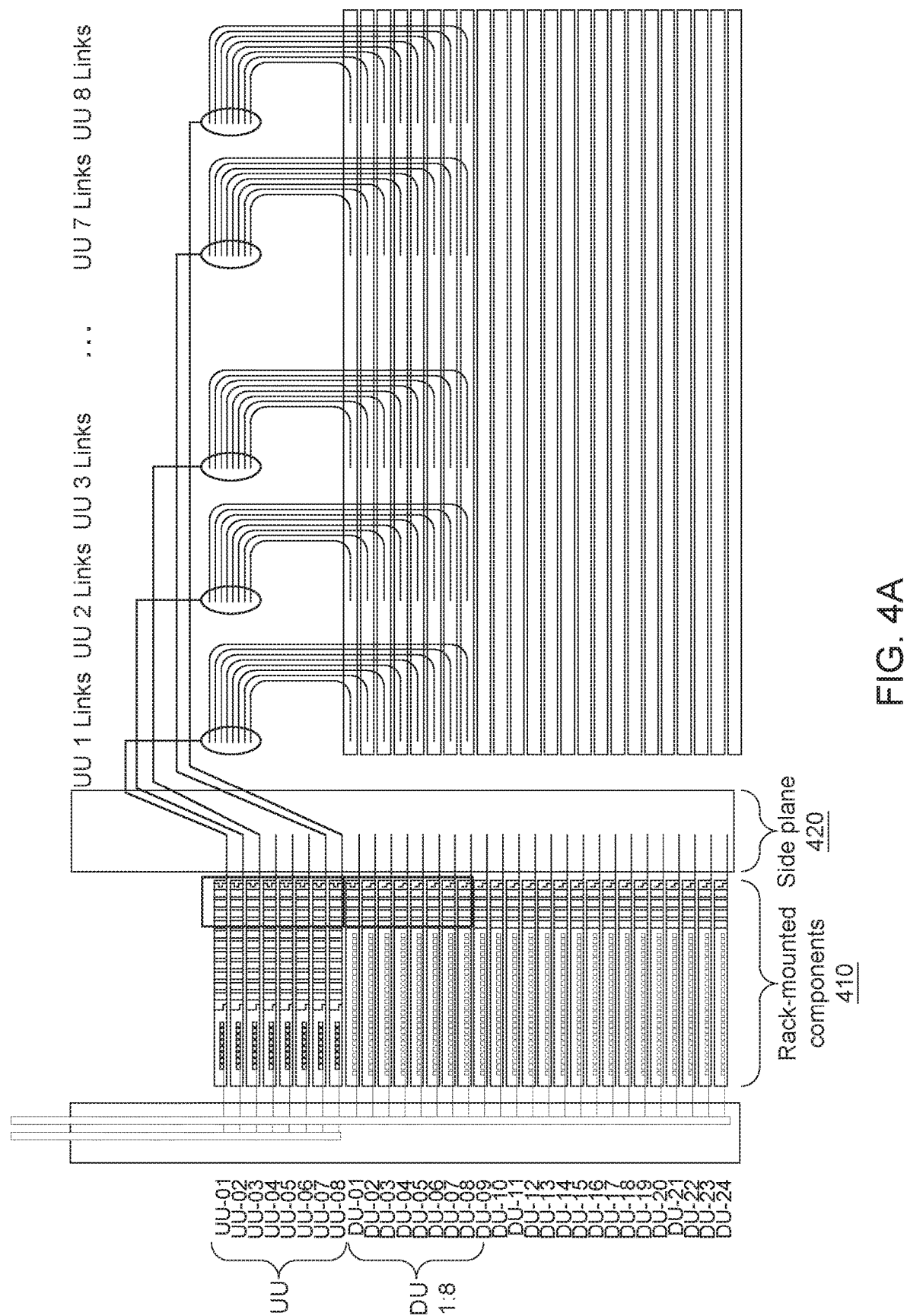
FIG. 4A shows an example of cabling connections between upstream units (UU) and a first subset of downstream units (DU) in a network rack assembly with a vertical connection interface sideplane according to an embodiment of the present disclosure.

FIG. 4A shows an example of cabling connections between upstream units (UU) and a first subset of downstream units (DU) in a network rack assembly with a vertical connection interface sideplane according to an embodiment of the present disclosure. The network rack assembly shown here corresponds to the one shown in FIG. 3, and includes rack-mounted components 410 and sideplane 420, which are like their counterparts in FIG. 3.

Here, there are eight UUs and 24 DUs. In this example, the UUs are connected (e.g., using cables) to DU1 to DU8, which is labeled as "DU 1:8" in the figure. The right portion of the figure shows the detailed connections between UU1 and each of DU1 through 8 ("UU 1 Links"), UU 2 and each of DU1 through DU8 ("UU 2 Links"), and so on through UU8.

Figure 4B:
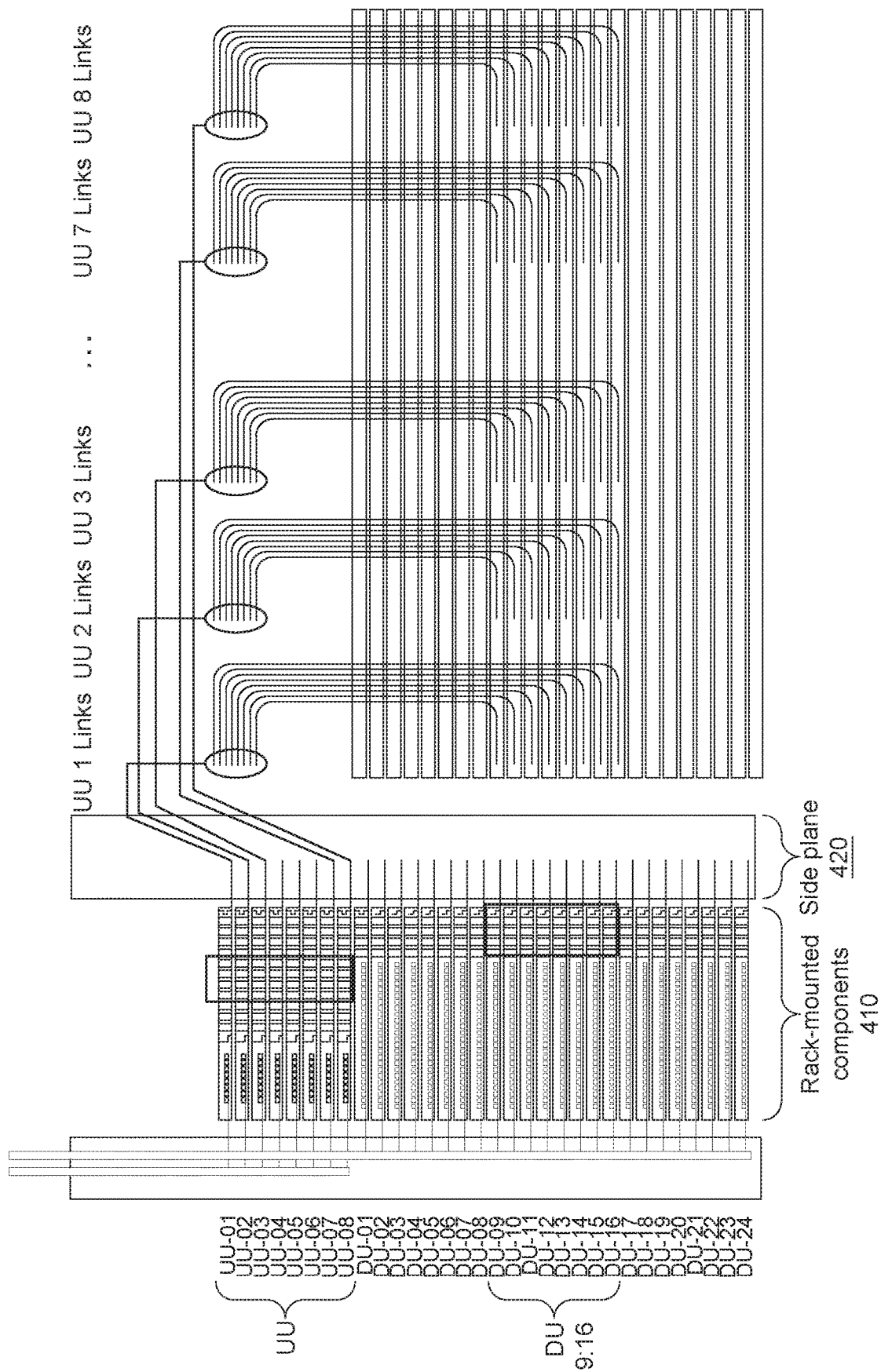
FIG. 4B shows an example of cabling connections between upstream units (UU) and a second subset of downstream units (DU) in a network rack assembly with a vertical connection interface sideplane according to an embodiment of the present disclosure.
Figure 4C:
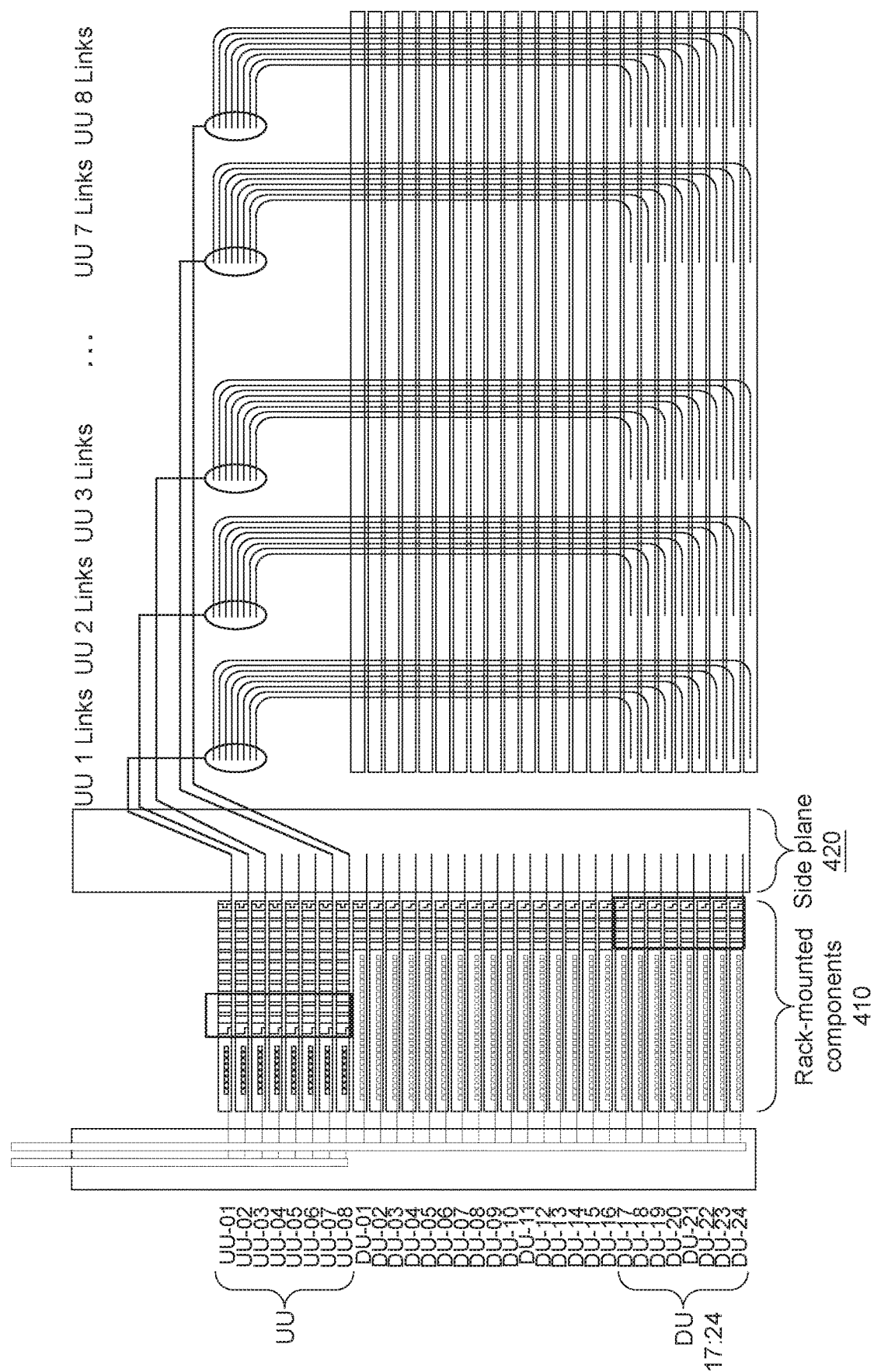
FIG. 4C shows an example of cabling connections between upstream units (UU) and a third subset of downstream units (DU) in a network rack assembly with a vertical connection interface sideplane according to an embodiment of the present disclosure.

FIG. 4B shows an example of cabling connections between upstream units (UU) and a second subset of downstream units (DU) in a network rack assembly with a vertical connection interface sideplane according to an embodiment of the present disclosure. Unlike the example in FIG. 4A, the connections (e.g., using cables) depicted here are between the UUs and DU9 to DU16, which are labeled as "DU 9:16" in the figure. The right portion of the figure shows the detailed connections between UU 1 and each of DU9 through DU16 ("UU 1 Links"), UU 2 and each of DU9 through DU16 ("UU 2 Links"), and so on through UU8.

FIG. 4C shows an example of cabling connections between upstream units (UU) and a third subset of downstream units (DU) in a network rack assembly with a vertical connection interface sideplane according to an embodiment of the present disclosure. Unlike the example in FIG. 4A, the connections (e.g., using cables) depicted here are between the UUs and DU17 to DU24, which are labeled as "DU 17:24" in the figure. The right portion of the figure shows the detailed connections between UU 1 and each of DU17 through DU24 ("UU 1 Links"), UU2 and each of DU17 through DU24 ("UU 2 Links"), and so on through UU8.

For clarity, the connections between the UUs and the DUs are illustrated using three separate figures (FIG. 4A for DU 1:8, FIG. 4B For DU 9:16, and FIG. 4C for DU 17:24). These connections may co-exist in the same switch assembly. In each of FIGS. 4A-4C, sideplane 420 helps with organizing the cable connections between the UUs and the DUs. The following figures show examples of a network rack with a vertical connection interface sideplane.

Figure 5A:
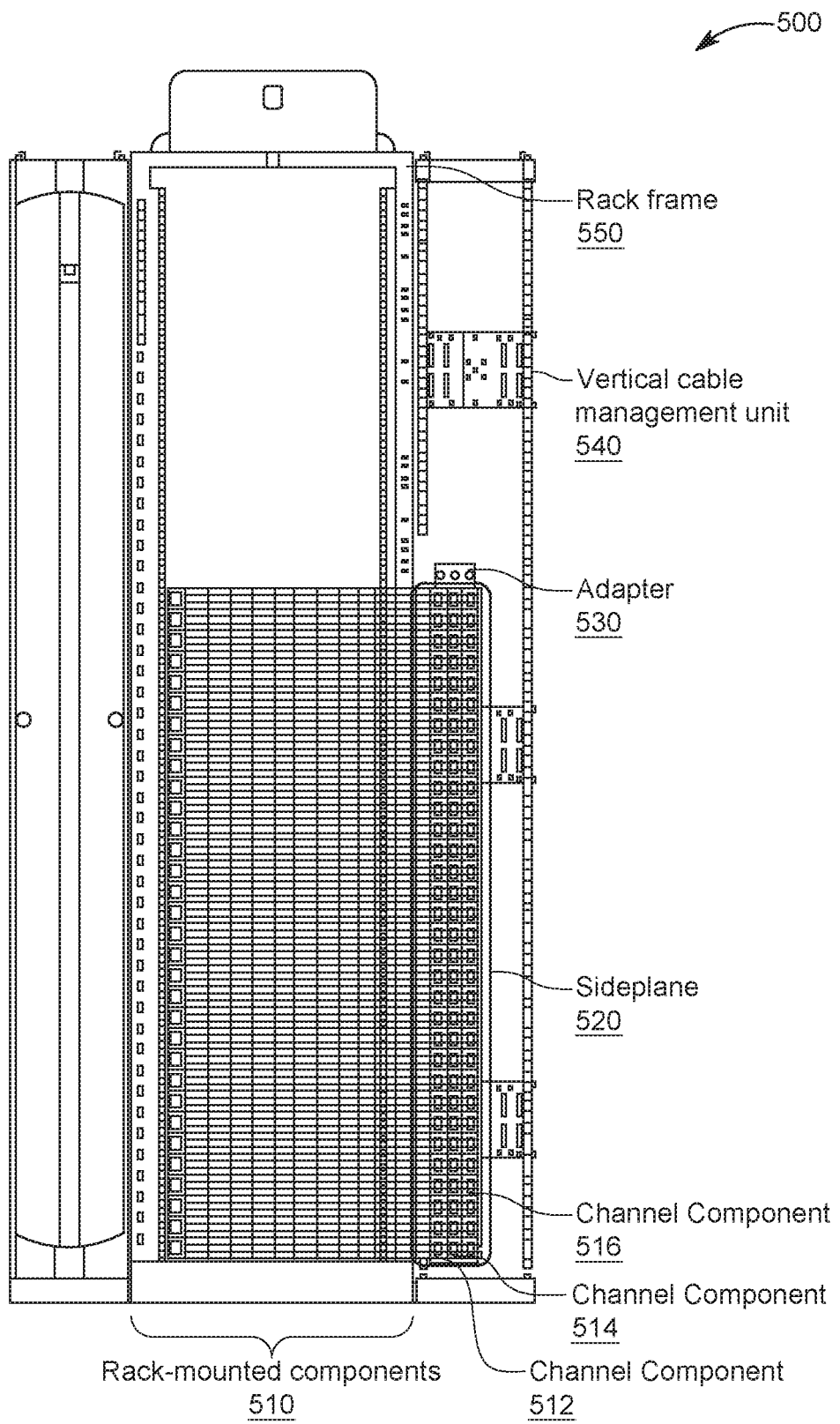
FIG. 5A illustrates an embodiment of a vertical connection interface sideplane coupled to a frame of a network rack.
Figure 5B:
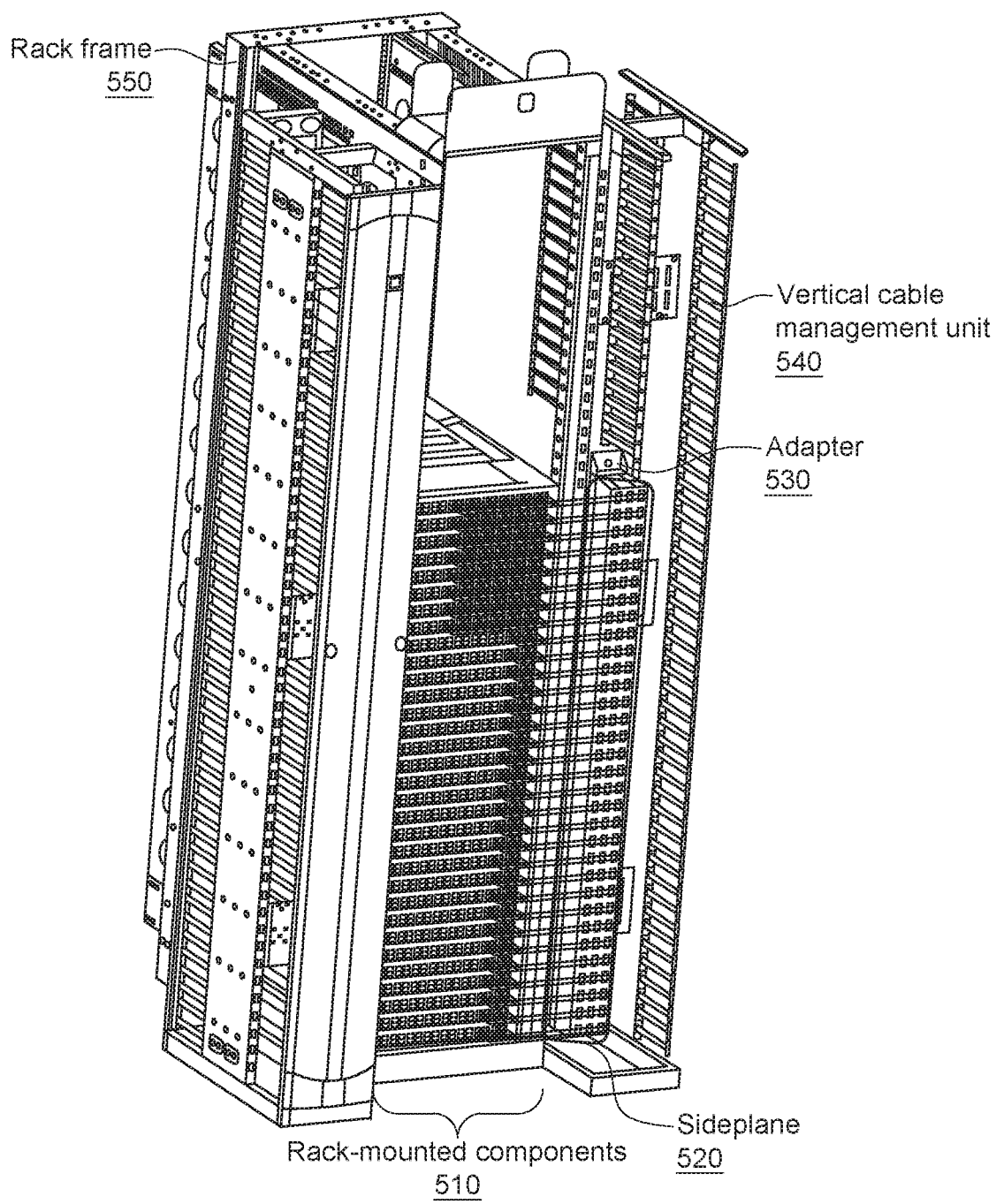
FIG. 5B shows a perspective view of the embodiment of the vertical connection interface sideplane shown in FIG. 5A.

FIG. 5A illustrates an embodiment of a vertical connection interface sideplane coupled to a frame of a network rack. FIG. 5B shows a perspective view of the embodiment of the vertical connection interface sideplane shown in FIG. 5A.

Figure 9:
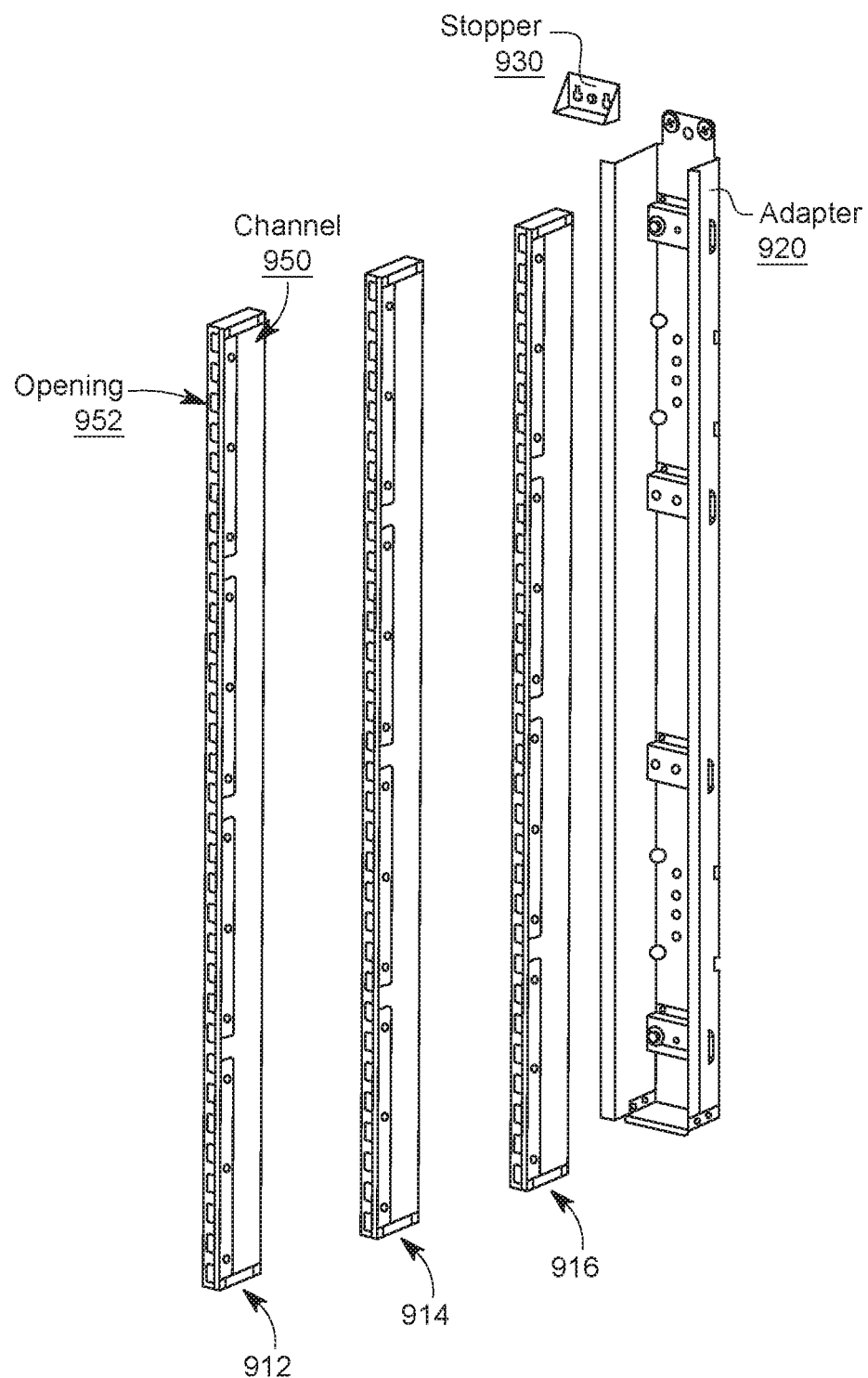
FIG. 9 illustrates an embodiment of several vertical connection interface sideplane components for direct attached cable (DAC) connections.

The assembly 500 shown includes a frame of a network rack (rack frame 550) and sideplane 520. Rack frame 550 is adapted to receive rack units 510. Here, a portion of the rack frame has been filled with rack units. The racks units are connected to each other by cables, and the cables are managed by a sideplane 520 which is provided alongside the rack frame 550. Sideplane 520 is adapted for intra-rack connections and management. In this example, sideplane 520 includes three channel components 512, 514, and 516 and an adapter 530. An exploded view of an example sideplane (including its constituent components) and an adapter is shown in FIG. 9.

In some embodiments, the sideplane is configured to be removably attached to a mounting adapter, and the mounting adapter is attached to the rack frame. In some embodiments, the mounting adapter is attached to the vertical cable management unit 540. The adapter bracket can be versioned for different types of racks, allowing the sideplane to be coupled to a variety of network racks. In various embodiments, the mounting adapter is configured to be coupled to the sideplane on a side of the network rack outside a frame of the network rack.

In this example, the vertical cable management unit 540 is shown as a frame that is disposed next to the rack frame and forming a space in which to provide the sideplane. The vertical cable management unit is optional, and is not present in some embodiments. One or more connections between devices mounted on the network rack are routed via one or more protected channels in between the sideplane and the mounting adapter. In various embodiments, the space the sideplane takes is half or less than half of the rack frame, e.g., 10 feet or less and the sideplane itself is 5 feet wide or less.

In various embodiments, cabling connections for UUs and DUs are completed inside the sideplane without taking up space in the network rack 510. The sideplane increases the flexibility of handling many cables. Unlike typical server racks, which tend to have tangled cables when there is a high density of cables, the sideplane described here helps with cable organization and management, reducing the power consumed, cost of implementation, and helping a problem area to be identified quickly and accurately. The sideplane has a relatively small footprint compared with the network rack.

In a large chassis, a backplane, which runs along the back of the network rack behind the rack units, may provide some cable organization. With the sideplane described here, a backplane is not needed. The sideplane is provided next to the racks, having a longitudinal axis that runs from the top of the stack of rack units to the bottom of the stack of rack units as shown. The sideplane enables the cable assembly to be easily changed without affecting the setup of the UU and DU. For example, replacing or repairing a damaged connector can be difficult in a backplane, but the sideplane assembly described here allow connectors to be easily replaced or repaired.

The sideplane supports a variety of types of cabling configurations. Two examples are described below: direct attachment cables (FIG. 6) and active optical cables (FIG. 10). In addition, the sideplane accommodates conventional cables such as CWDM4. High-speed DAC is cost-effective and consumes less power. AOC supports greater transmission distances. CWDM4 optical cabling, which is durable for repurposing and reconnecting cabling.

FIG. 6 illustrates an embodiment of a vertical connection interface sideplane with direct attached cable (DAC) connections. The assembly shown in FIG. 6 includes rack-mounted components 610 and sideplane 620. Unlike the example in FIG. 3, connections are shown between UUs and DUs. Cables connect UUs and DUs and run through the sideplane. In this example, there are two columns/channels of openings in the sideplane (e.g., a third column is available to be installed but not shown in FIG. 6). Opening 622 is an example of an opening through which a cable can be routed. The opening within a column open up on the backside of the sideplane to a single channel, in various embodiments. For example, openings 622 and 624 are in the same column and are part of the same channel through which cables may be routed. Here, the UUs and DUs are connected by DAC cables. In various embodiments, DAC cabling does not require any transceiver power or any power for internal connections. One end of the cable is plugged into a port of a rack unit and the other end is plugged into a port in the sideplane as shown in FIG. 6.

FIG. 7 shows an example of direct attached cable (DAC) cables routed through a cross section of a sideplane channel. The cables may be routed through the sideplane channel component as shown. The cables can be sized to a length that provides a desired amount of slack when connecting components. Cables of unequal lengths may be used throughout the server assembly.

Figure 8:
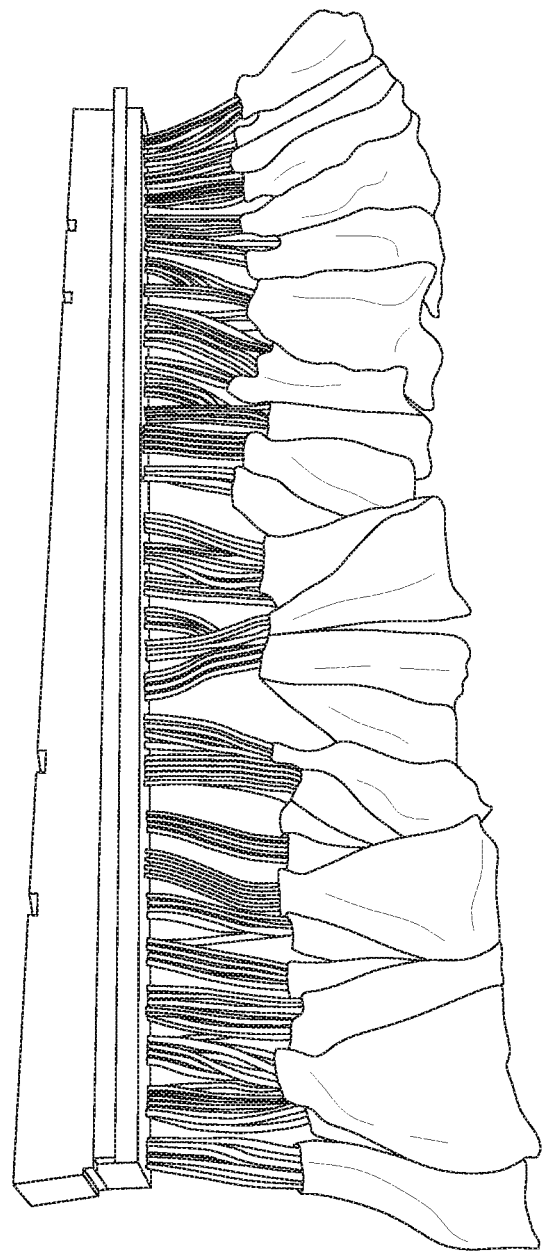
FIG. 8 shows an example of direct attached cable (DAC) cables routed and provided inside a vertical connection interface sideplane channel component.

One advantage of the sideplane described here are the channels that are adapted to receive and manage the cables. This allows cables to be pre-attached to the sideplane, which expedites set up a server assembly. FIG. 8 shows an example of direct attached cable (DAC) cables routed and provided inside a vertical connection interface sideplane channel component. The cabling can be pre-attached/pre-routed to the sideplane channel component and provided ready to be connected to rack-mounted components.

In some embodiments, a group of sideplane components provide cable management and organization for a server assembly. The following figures shows an example of several vertical connection interface sideplanes for DAC cables.

FIG. 9 illustrates an embodiment of several vertical connection interface sideplane components for direct attached cable (DAC) connections. The DAC sideplane assembly shown in this example includes three vertical connection interface sideplane channel components 912, 914, 916. Each of the sideplane channel components have a respective channel to facilitate replacement and maintenance of cables. The channel corresponding to sideplane channel component 912 is labeled as channel 950. Channel 950 runs inside the sideplane channel component. Periodic openings (e.g., opening 952) that are provided along the length of the sideplane channel component provide access to the interior channel where cabling can enter/exit the channel where cabling can be routed. The rear of each sideplane channel component may be open and is covered when installed within mounting adapter 920.

This drawings shows an exploded view of three sideplane channel components. The sideplane channel components may be removably attached adjacent to each other in parallel within mounting adapter 920. Each of the sideplane channel components 912, 914, 916 can be assembled and mounted individually. Adapter 920 is configured to attach the sideplane assembly shown here to a rack frame or a vertical cable management unit, and is an example of how adapter 530 of FIGS. 5A and 5B can be structured. Stopper 930 secures the sideplane channel components to mounting adapter 920 and prevents the sideplane channel components from disengaging from the adapter.

In an example embodiment, the dimensions for a DAC assembly are: 32 rack units tall, 1.3 inches wide, 4 inches deep, and supporting 64 DAC. Each sideplane channel component is adapted to support 64 DAC cables, connecting each UU to 8 DUs. For example, the first sideplane channel component 912 services a UU to DU1 to DU8 (corresponding to FIG. 4A), the second sideplane channel component 914 services a UU to DU9 to DU16 (corresponding to FIG. 4B), and the third sideplane channel component 916 services a UU to DU17 to DU24 (corresponding to FIG. 4C).

The number and placement of sideplane channel components shown here is merely exemplary and not intended to be limiting. For example, here the three sideplane channel components effectively support the desired number of DAC cables. Additional sideplane channel components can be provided to support additional cabling, for example.

FIG. 10 illustrates an embodiment of a vertical connection interface sideplane with pigtail active optical cable (AOC) connections. The assembly shown in FIG. 10 includes rack-mounted components 1010 and sideplane 1020. Sideplane 1020 is adapted to include connectors with appropriate pre-routed connections such that AOC cables can be connected to the connectors on the sideplane rather requiring it be routed through the sideplane from one end point to the other end point. AOC cables can be used to connect together UUs and DUs. The sideplane modules implemented according to the techniques described accommodate secure, high-density connections between MPO/MTP connectors. Sideplane configuration includes multi-module, single-module, and MPO/MPO 8-48 fibers connectors. AOC cables have several advantages including being relatively low cost, easy to install and maintain, and consuming relatively little power. In various embodiments, AOC cabling consumes around 2 W of transceiver power and around 768 W of power for internal connections. The pigtail design makes the cables easy to install and replace. In some embodiments, using OM3 multiple mode fiber minimizes fiber cleaning work. In various embodiments, the fiber polarity is customized in the sideplane.

Figure 11:
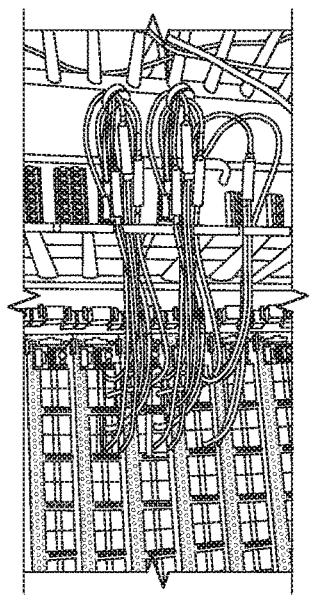
FIG. 11 shows a close-up view of an embodiment of a vertical connection interface sideplane with pigtail active optical cable (AOC) connections.

FIG. 11 shows a close-up view of an embodiment of a vertical connection interface sideplane with pigtail active optical cable (AOC) connections. The cables shown in this example have one end plugged into a rack mounted switch and another end to a port in the sideplane. The connections are further described below. As shown, there is some slack in the cable. The cable length and slack can be selected to optimize for the port connection and well-organized cabling.

Figure 12A:
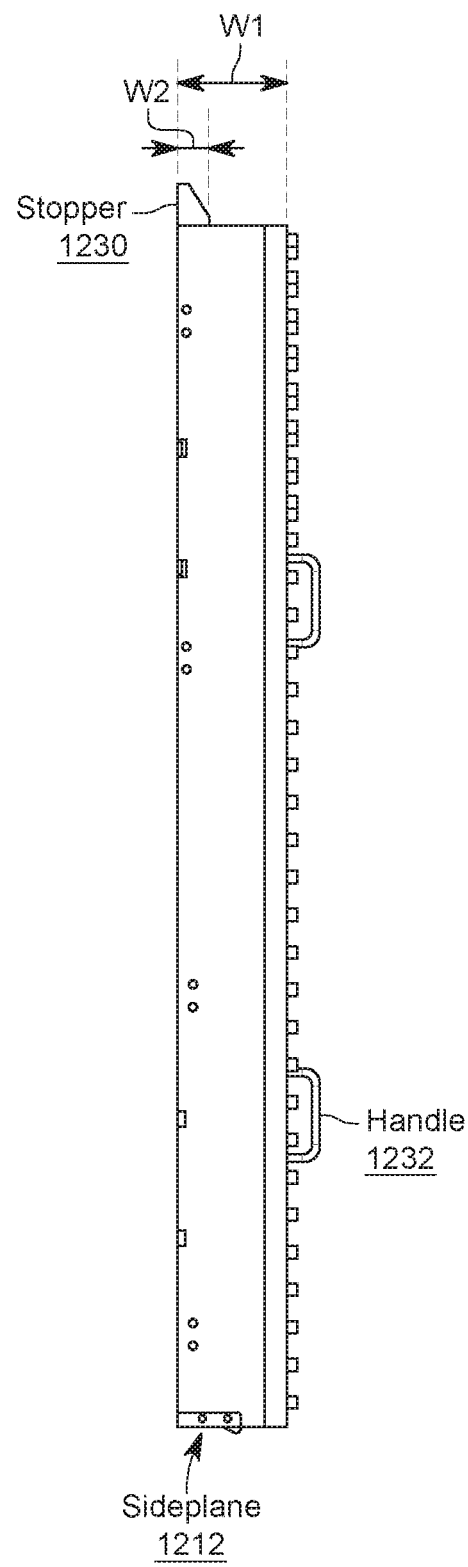
FIG. 12A is a side view of a vertical connection interface sideplane for active optical cables (AOC) according to an embodiment.

FIG. 12A is a side view of a vertical connection interface sideplane for active optical cables (AOC) according to an embodiment. The example sideplane shown here accommodates 192 links, which corresponds to 8 UUs and 24 DUs. The rack units can be relatively small (e.g., 2 inches×4 inches) for easy installation. In some embodiments, a variety of optical fiber can be used including single mode and multi-mode. In some embodiments, a one or more handles 1232 are mounted on the sideplane to facilitate handling and transportation of the sideplane.

Figure 12B:
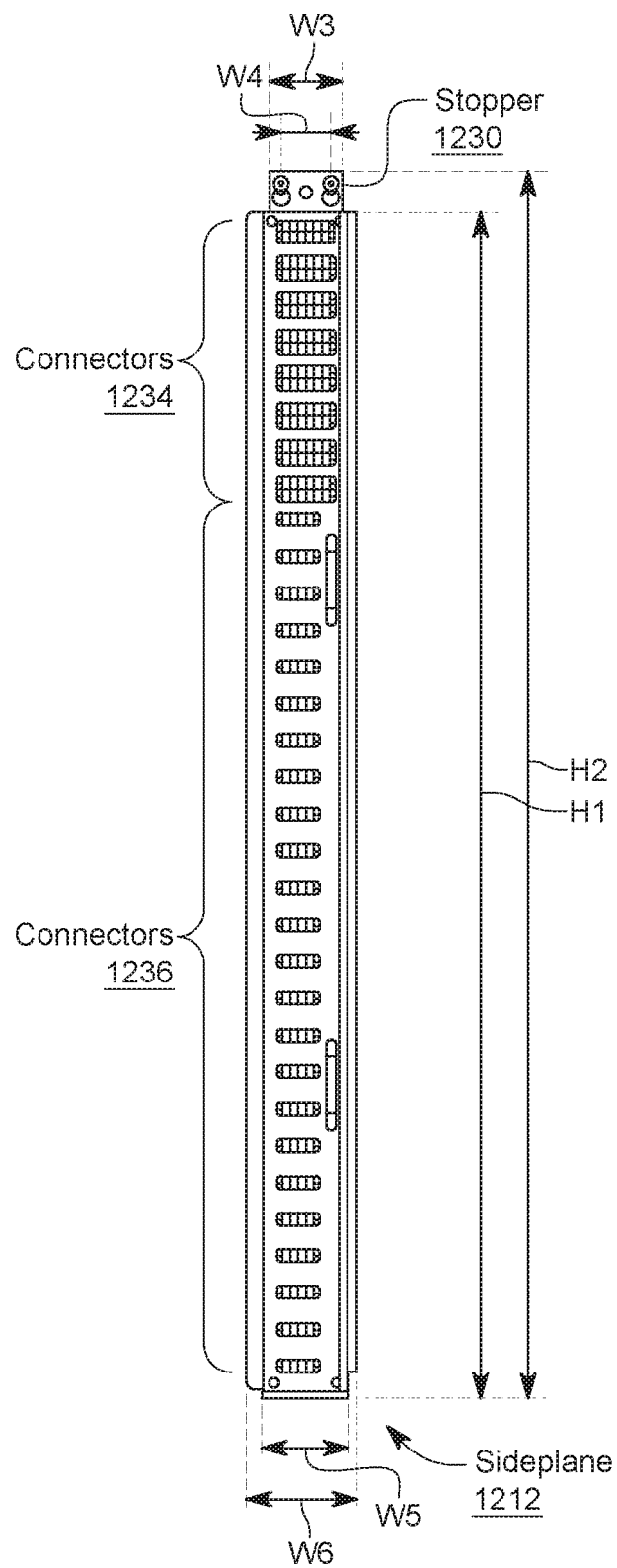
FIG. 12B is a front view of a vertical connection interface sideplane for active optical cables (AOC) according to an embodiment.

FIG. 12B is a front view of a vertical connection interface sideplane for active optical cables (AOC) according to an embodiment. As shown, the sideplane includes connectors, and AOC cables can be plugged into the connectors as further described below. In contrast to the example sideplanes shown in FIG. 6, the sideplane here includes connectors, which may facilitate cable management. For example, the connectors can be labeled to help quickly identify where a link has failed. In this example, the top section of connectors 1234 are of a first type (e.g., for UUs) and the bottom sections of connectors 1236 are of a second type (e.g., for DUs). Individual connector ports in the top section of connectors 1234 are connected to appropriate ports on the bottom sections of connectors 1236 via a network of cables on the rear side of the sideplane. For example, each port in the top section of connectors 1234 of sideplane 1212 is connected to a corresponding port in the bottom sections of connectors 1236 via a cable that runs behind sideplane 1212. By integrating ports and pre-routed cabling connections between the appropriate ports, the installation and administration of the connections between rack mounted components is simplified as a rack mounted device is connected to another device via a shorter cable to a connector port on the sideplane rather than routing a longer cable directly between devices.

Figure 12C:
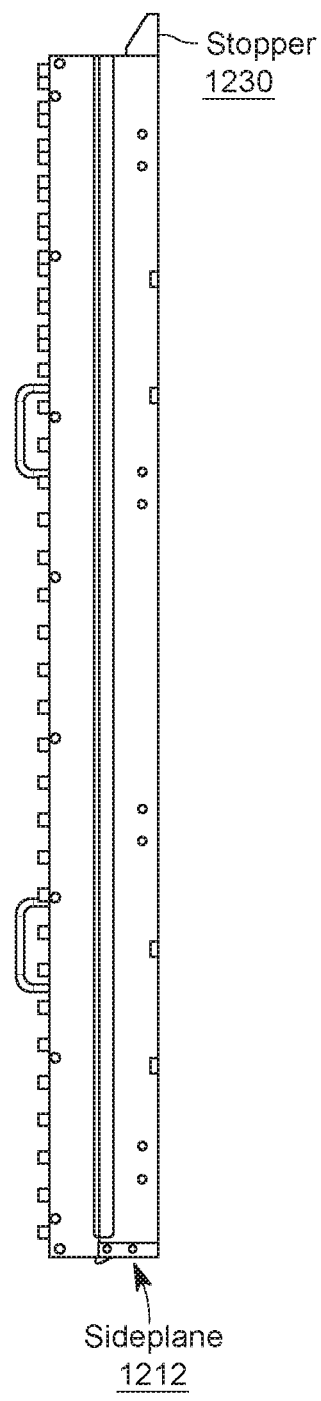
FIG. 12C is another side view of a vertical connection interface sideplane for active optical cables (AOC) according to an embodiment.

FIG. 12C is another side view of a vertical connection interface sideplane for active optical cables (AOC) according to an embodiment. Stopper 1230 secures the sideplane 1212 within mounting adapter 1220 and prevents the sideplane from dislodging out of mounting adapter 1220.

Some example dimensions are labeled in FIG. 12A-12C. Example dimensions (in inches) are: W1=133.5, W2=39.5, W3=87.6, W4=59.6, W5=105, W6=133.6, H1=1430.9, H2=1481.7. These example dimensions are not intended to be limiting.

Figure 12D:
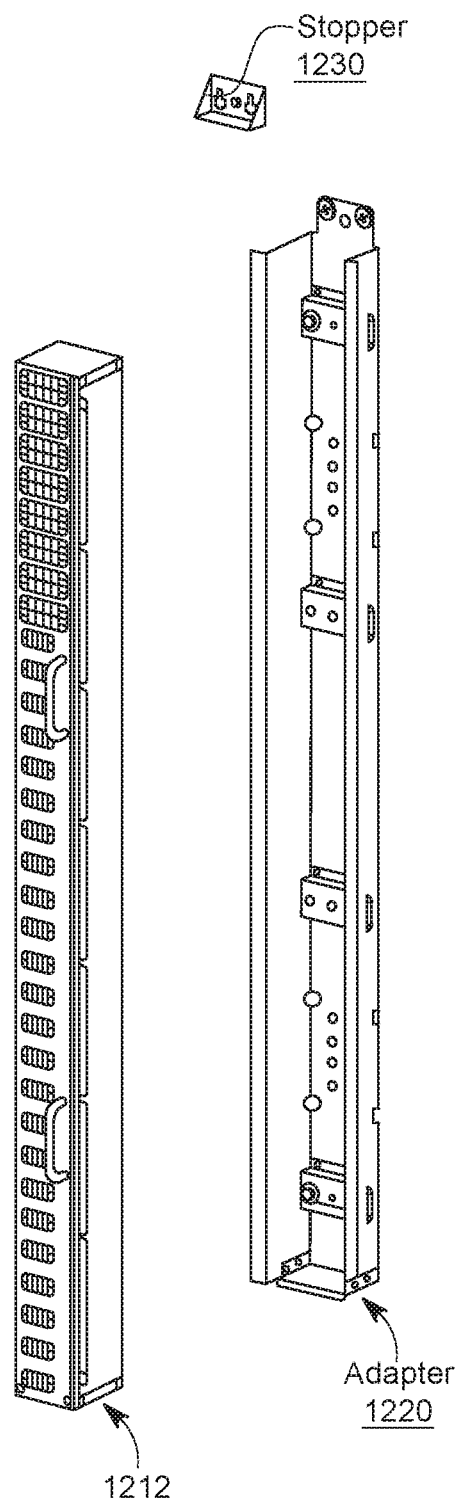
FIG. 12D is a perspective view of a vertical connection interface sideplane for active optical cables (AOC) according to an embodiment.

FIG. 12D is a perspective view of a vertical connection interface sideplane for active optical cables (AOC) according to an embodiment. In contrast to FIGS. 12A-12C, this is an exploded view that shows sideplane 1212 separated from adapter 1214. When assembled, sideplane 1212 is removably attached to adapter 1220. As described with respect to FIGS. 5A and 5B, the adapter 1220 is configured to removably connect the sideplane to a rack. Using dual pigtail AOCs can reduce the total number of multi-fiber push on (MPO) connectors used. The number and placement of the sideplane 1212 shown here is merely exemplary and not intended to be limiting. The sideplane assembly is scalable to include additional sideplanes to accommodate more cables or heavier cables.

FIG. 13 shows an example of a dual pigtail active optical cable (AOC) cable. The dual pigtail AOC cable has a first end 1310 that breaks out into end 1320 and end 1330. In some embodiments, the first end 1310 plugs into a rack-mounted component such as a switch, and the other ends plug into a connector/port in the sideplane. Behind the sideplane, there is cabling that delivers the signal from the connector/port to another connector/port on the sideplane that is connected to another rack-mounted component. First end 1310 can include MTP24 or MPO24, for example. The cable 1340 can be a bundled optical fiber, for example 16 OM3/OM4 fibers. The ends 1320 and 1330 can be 100G QSFP28. The two ends (1320, 1330) share the same connector (1310) to increase the density of the AOC sideplane assembly. The pigtail AOC cable shown here can be plugged into a connector/port on the sideplane. As shown in FIG. 16, a connector can be implemented by the connector shown in FIG. 14.

FIG. 14 shows an example of a pigtail active optical cable (AOC) pinout of a connector. This is an example of a pinout for the connector of the first end 1310 shown in FIG. 13. The pins shown here correspond to end 1310. There are two sets of pins for two ports because the signals from ends 1320 and 1330 have been combined. As shown, one set of pins is for a first port and another set of pins is for a second port. For example, the top set of pins is for "Port-1," corresponding to signals from end 1320, which the bottom set of pins is for "Port-2," corresponding to signals from end 1330.

FIG. 15 illustrates an embodiment of a panel of a vertical connection interface sideplane with a pigtail active optical cable (AOC). The panel here includes connectors adapted to receive cables. The AOC cables are shown plugged into the sideplane assembly of FIG. 15. A number of switch ports are shown on the right-hand side and is further described in FIG. 18.

Figure 18:
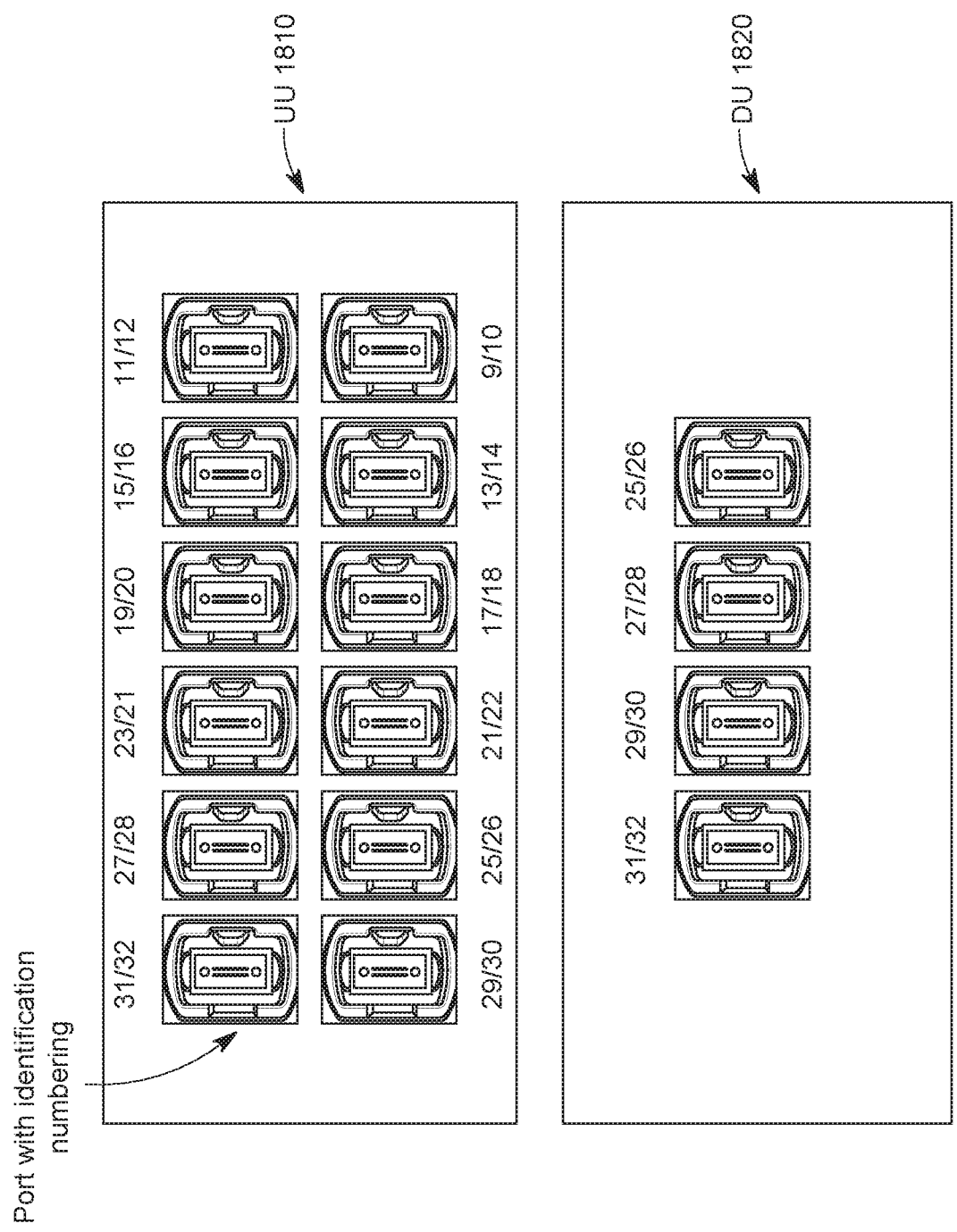
FIG. 18 shows an example of connector ports on a vertical connection interface sideplane.

FIG. 16 illustrates an embodiment of a front panel of a vertical connection interface sideplane for a pigtail active optical cable (AOC). The panel here includes connectors/ports adapted to receive connection from AOC cables. In this example, there are cables plugged into the last group of ports (DU ports) at the bottom, but not the ports all top to more clearly illustrate the ports on the sideplane. The groups (e.g., each group has 12 ports) at the top of the panel are UU ports. The bottom group (e.g., having 4 ports) are DU ports. FIG. 18 shows an example of the two types of ports and numbering for the ports.

Figure 17:
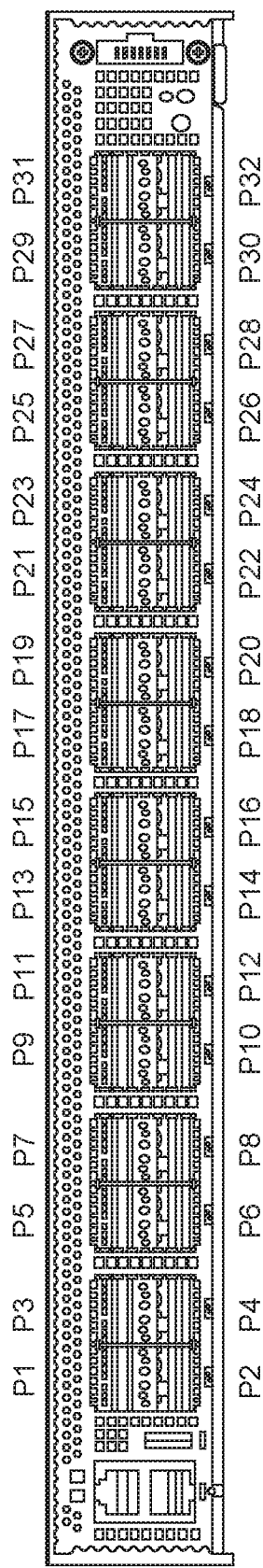
FIG. 17 shows an example of switch port numbering for a rack-mounted component.

FIG. 17 shows an example of switch port numbering for a rack-mounted component. This is an example of a rack-mounted component that can be disposed with the network frame as shown in FIG. 3. This example shows 32 ports, which are numbered. The numbers correspond to the panels shown in the figure below. For example, a pigtail AOC like the one shown in FIG. 13 can have ends (with Quad Small Form-factor Pluggable (QSFP) optical transceivers on the ends) plugged into ports in the rack-mounted component of FIG. 17 and the other ends plugged into a connector of the sideplane panels shown in FIG. 18.

FIG. 18 shows an example of connector ports on a vertical connection interface sideplane. The example UU panel section 1810 on a front of a sideplane includes 12 ports with identification numbering. In this example, the higher port numbers are positioned on an end of a sideplane closer to the mounting adapter—in this case at the left side—or easier cable routing. The example DU panel section 1820 on the sideplane includes four ports. In this example, the higher port numbers are placed at the left side for easier fiber routing.

Figure 19:
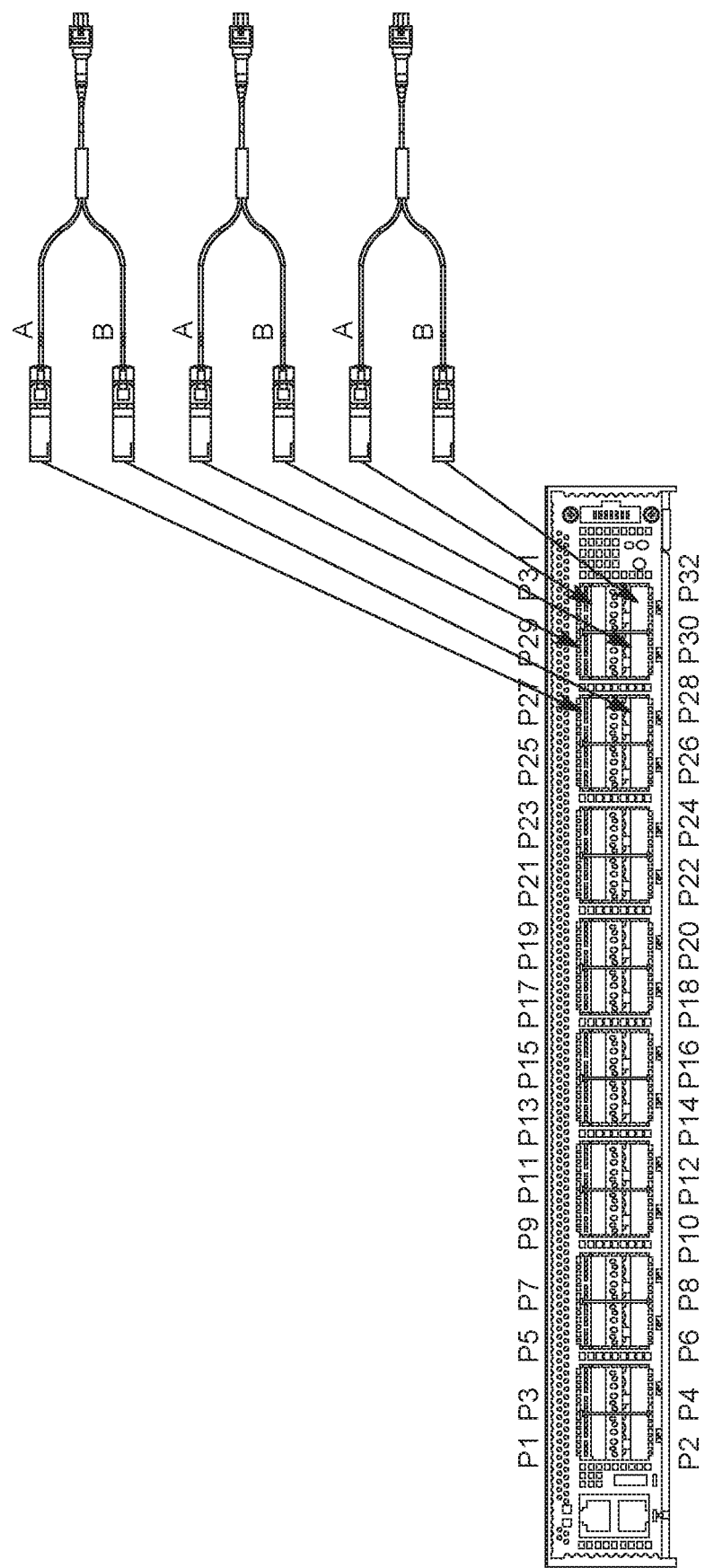
FIG. 19 is a block diagram illustrating an embodiment of a switch port and pigtail active optical cable (AOC) with example connections.
Figure 20:
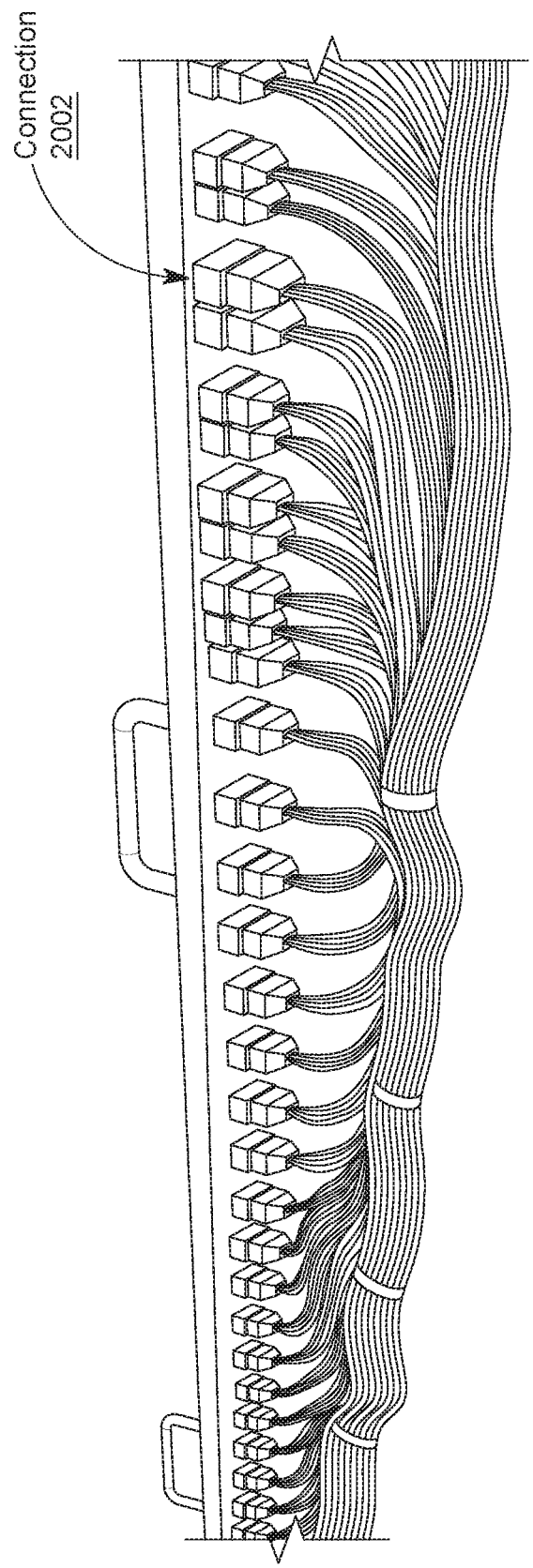
FIG. 20 is a side view of a vertical connection interface sideplane for pigtail active optical cable (AOC) cables.

FIG. 19 is a block diagram illustrating an embodiment of a switch port and pigtail active optical cable (AOC) with example connections. In this example, a first leg (A) of each pigtail AOC connects to the odd-numbered ports. A second leg (B) of each pigtail AOC connects to the even-numbered ports. The other end of each pigtail AOC connects to connectors/ports on a sideplane (e.g., as shown in FIG. 15). As shown in FIGS. 17-19, a pigtail cable can be used to connect two switch ports on one or more devices to a single connector port on the sideplane. For example, the single connector port on the sideplane effectively serves as a combined port for two different switch ports on the device(s) connected to the sideplane port via the pigtail cable. This connector port on the sideplane is connected to another connected port on the sideplane (e.g., via a single cable running inside a protected channel of the sideplane that is behind a front panel of the sideplace as shown in FIG. 20). This other port can then be connected to a plurality of switch ports on one or more other devices using another pigtail cable. Thus by effectively combining functionality of multiple cables (e.g., for different connections) into a single cable that is connecting together ports on the sideplane (e.g., a single port on the sideplane effectively serves a combined port for multiple different connections), the amount of cabling is reduced.

FIG. 20 is a side view of a vertical connection interface sideplane for pigtail active optical cable (AOC) cables. This example shows the network of cables on a backside of the sideplane. For example, a connection 2002 on the rear side of the sideplane corresponds to a port on the front side of the sideplane, and connection 2002 connects to a cable that connects to another connector on the rear side of the sideplane corresponding to another port on the front side of the sideplane.

As detailed above, there are many advantages to the sideplane assembly disclosed. For example, cabling is simplified, operational ease is increased (e.g., weight is decreased and the organization helps making it easier to identify an exact location where an error occurred), power consumption is decreased, and cost is decreased. Although a greater density of cables can be disposed in the sideplane described here (e.g., 192 cables), which is an order of magnitude larger than typical servers (e.g., 20-40 cables), the cables are effectively managed by the sideplane.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising:
a vertical connection interface sideplane configured to be removably attached to a mounting adapter and route one or more connections between devices mounted on a network rack via a protected channel in between the vertical connection interface sideplane and a mounting adapter; and
the mounting adapter configured to receive channel components of the vertical connection interface sideplane and to couple to the vertical connection interface sideplane to a side of the network rack outside a frame of the network rack.

2. The system of claim 1, wherein the devices mounted on the network rack include a plurality of network switches.

3. The system of claim 1, wherein the devices collectively implement a single logical switch.

4. The system of claim 1, wherein the devices include a plurality of upstream units and a plurality of downstream units coupled by the one or more connections.

5. The system of claim 1, wherein the one or more connections includes direct attachment cables with end connectors that directly connect to one or more of the devices.

6. The system of claim 1, wherein the one or more connections includes active optical cables.

7. The system of claim 1, wherein the one or more connections includes a dual pigtail cable.

8. The system of claim 1, wherein the vertical connection interface sideplane includes a plurality of channel components configured to be individually removably attached to the mounting adapter and each route one or more different connections between corresponding devices mounted on the network rack via a corresponding protected channel portion.

9. The system of claim 8, wherein the plurality of channel components provide parallel and adjacent protected channels in the system.

10. The system of claim 1, wherein the vertical connection interface sideplane includes a plurality of cable routing openings to the protected channel.

11. The system of claim 1, wherein the mounting adapter is directly coupled to the frame of the network rack.

12. The system of claim 1, wherein the mounting adapter is coupled to the frame of the network rack via a vertical cable management unit coupled to the frame of the network rack.

13. The system of claim 1, wherein the vertical connection interface sideplane is adapted to route at least 192 connections.

14. The system of claim 1, wherein the vertical connection interface sideplane includes an upper panel portion of ports for upstream network switch units of the devices and a lower panel portion of ports for downstream network switch units of the devices.

15. The system of claim 1, wherein the vertical connection interface sideplane includes a connector port configured to carry signals from both a first one and a second one of the devices to a third one of the devices.

16. The system of claim 1, wherein the vertical connection interface sideplane includes a first connector port and a second connector port on a front side of the vertical connection interface sideplane, and the first connector port and the second connector port are connected together via a cable routed behind the front side of the vertical connection interface sideplane and in the protected channel.

17. The system of claim 1, further comprising a stopper adapted to secure the vertical connection interface sideplane to the mounting adapter.

18. The system of claim 1, wherein the vertical connection interface sideplane includes one or more handles configured to be held by an installer when transporting, coupling, or removing the vertical connection interface sideplane from the mounting adapter.

19. A method, comprising:
coupling a mounting adapter configured to a side of a network rack outside a frame of the network rack; and
coupling a vertical connection interface sideplane to the mounting adapter, wherein the mounting adapter is configured to receive channel components of the vertical connection interface sideplane and route one or more connections between devices mounted on the network rack via a protected channel in between the vertical connection interface sideplane and the mounting adapter.

20. A method, comprising:
manufacturing a vertical connection interface sideplane configured to be removably attached to a mounting adapter and route one or more connections between devices mounted on a network rack via a protected channel in between the vertical connection interface sideplane and a mounting adapter; and manufacturing the mounting adapter configured to receive channel components of the vertical connection interface sideplane and to couple the vertical connection interface sideplane to a side of the network rack outside a frame of the network rack.

* * * * *